United States Patent
Mevellec et al.

(10) Patent No.: US 11,384,445 B2
(45) Date of Patent: Jul. 12, 2022

(54) PROCESS FOR ELECTRODEPOSITION OF COBALT

(71) Applicant: aveni, Massy (FR)

(72) Inventors: Vincent Mevellec, Boulogne Billancourt (FR); Dominique Suhr, Chatenay Malabry (FR); Mikailou Thiam, Compiegne (FR); Louis Caillard, Paris (FR)

(73) Assignee: aveni, Massy (FR)

( * ) Notice: Subject to any disclaimer, the term of this patent is extended or adjusted under 35 U.S.C. 154(b) by 0 days.

(21) Appl. No.: 16/982,421

(22) PCT Filed: Mar. 15, 2019

(86) PCT No.: PCT/EP2019/056593
§ 371 (c)(1),
(2) Date: Sep. 18, 2020

(87) PCT Pub. No.: WO2019/179897
PCT Pub. Date: Sep. 26, 2019

(65) Prior Publication Data
US 2021/0079547 A1    Mar. 18, 2021

Related U.S. Application Data

(60) Provisional application No. 62/789,554, filed on Jan. 8, 2019.

(30) Foreign Application Priority Data

Mar. 20, 2018 (FR) .................................. 1852386
Jun. 15, 2018 (FR) .................................. 1855300

(51) Int. Cl.
*C25D 3/12* (2006.01)
*C25D 5/50* (2006.01)
(Continued)

(52) U.S. Cl.
CPC ............... *C25D 3/12* (2013.01); *C25D 5/50* (2013.01); *C25D 7/123* (2013.01);
(Continued)

(58) Field of Classification Search
CPC ...................................................... C25D 3/12
See application file for complete search history.

(56) References Cited

U.S. PATENT DOCUMENTS

| | | |
|---|---|---|
| 3,905,776 A | 9/1975 | Long et al. |
| 4,441,969 A | 4/1984 | Tremmel |
| (Continued) | | |

FOREIGN PATENT DOCUMENTS

| | | |
|---|---|---|
| JP | S60190588 | 9/1985 |
| JP | S62103387 | 5/1987 |
| WO | 2016130224 | 8/2016 |

OTHER PUBLICATIONS

International Search Report and Written Opinion issued for International Patent Application No. PCT/EP2019/056593, dated Jun. 14, 2019, 11 pages.

*Primary Examiner* — Brian W Cohen
(74) *Attorney, Agent, or Firm* — Hamre, Schumann, Mueller & Larson, P.C.

(57) ABSTRACT

The present invention relates to a process for the fabrication of cobalt interconnections and to an electrolyte which enables the implementation thereof. The electrolyte which has a pH below 4.0 comprises cobalt ions, chloride ions and at most two organic additives of low molecular weight. One of these additives may be an alpha-hydroxy carboxylic acid or a compound having a pKa value ranging from 1.8 to 3.5.

14 Claims, 2 Drawing Sheets

Figure 1:
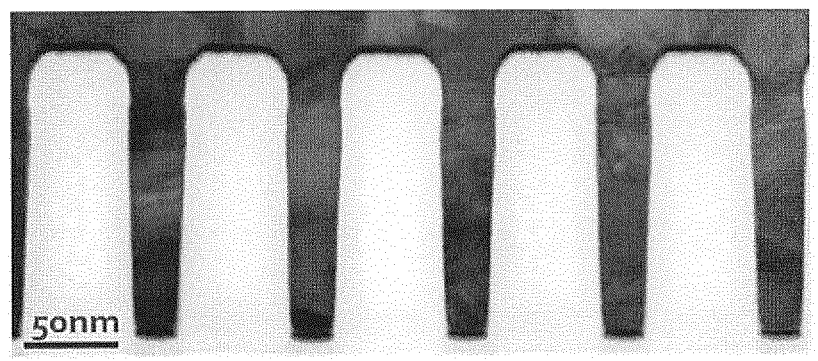

(51) Int. Cl.
*C25D 7/12* (2006.01)
*H01L 21/02* (2006.01)
*H01L 21/288* (2006.01)
*H01L 21/768* (2006.01)

(52) U.S. Cl.
CPC .... *H01L 21/02164* (2013.01); *H01L 21/2885* (2013.01); *H01L 21/76877* (2013.01)

(56) References Cited

U.S. PATENT DOCUMENTS

| | | | | |
|---|---|---|---|---|
| 4,904,353 | A * | 2/1990 | Shepard | C25D 5/48 205/171 |
| 9,777,386 | B2 * | 10/2017 | Doubina | C25D 7/123 |
| 11,035,048 | B2 * | 6/2021 | Commander | C25D 3/16 |
| 2005/0014359 | A1 | 1/2005 | Segawa et al. | |
| 2011/0253545 | A1 | 10/2011 | Kosbar et al. | |

* cited by examiner

PROCESS FOR ELECTRODEPOSITION OF COBALT

The present invention relates to the electrodeposition of cobalt on a conductive surface. More specifically, it relates to a process for electrodeposition of cobalt which can be used to fabricate electrical interconnections in integrated circuits.

PRIOR ART

Semi-conductor devices comprise conductive metal interconnections such as trenches running along the surface and vias connecting various levels of integration. The fabrication of the interconnections comprises etching of the structures in the dielectric material, followed by deposition of a metallic seed layer over the entire surface of the structures in order to improve their conductivity in the subsequent step of filling with a conductive metal, which filling step is usually carried out electrochemically.

The conventional processes for filling the interconnections with cobalt use electrolytes containing a cobalt salt and numerous organic additives including a suppressor and an accelerator with complementary functions for obtaining filling referred to as bottom-up filling. The combination of these additives is generally required in order to obtain a mass of cobalt of good quality, more particularly without material voids. The suppressor controls the deposition of the cobalt at the opening of the cavities and on the flat surface of the substrate which surrounds the cavities, by adsorbing onto the cobalt surface or by complexing with the cobalt ions. This compound can therefore be a molecule with high molecular weight, such as a polymer which cannot diffuse inside the cavities or a cobalt-ion-complexing agent. The accelerator, itself, diffuses to the bottom of the cavities and its presence is all the more necessary in very deep cavities. It makes it possible to increase the speed of deposition of the cobalt at the bottom of the cavities and also on their wall. The method of filling by a bottom-up mechanism is in contrast to a method of filling termed "conformal", in which the cobalt deposit grows at the same speed at the bottom and on the walls of the hollow patterns.

These electrodeposition baths and their use have several drawbacks which ultimately limit the correct operation of the electronic devices fabricated and makes them too expensive to fabricate. They in fact generate cobalt interconnections contaminated with the organic additives made necessary to limit the formation of fill holes in the cobalt. Moreover, the filling speeds obtained with these chemistries are too slow and are not compatible with an industrial-scale production.

The need therefore remains to provide electrolysis baths which produce cobalt deposits with improved performances, i.e. which have extremely reduced impurity contents, the speed of formation of which is sufficiently high to make the fabrication of the devices cost-effective, and which are devoid of material voids in order to ensure good conductivity.

The inventors have found that the alpha-hydroxy carboxylic acid family makes it possible to achieve this objective.

These additives are known in "bottom-up" or "super conformal" filling processes. In these processes, the bath must contain several additives for accelerating the deposition at the bottom of the cavities and slowing down the deposition on the flat zones of the substrate and the walls of the cavities. Such a system makes it possible to prevent the formation of voids in the cobalt deposit inside the cavities by premature closing of the cavity opening during filling.

However, the accelerator also acts on the flat surface of the substrate outside the cavities so that a leveller derived from alpha-hydroxy carboxylic acids is very often used to cancel out/reduce its effect, decrease the deposition of an excess of cobalt at the surface and avoid too long a subsequent polishing step. The alpha-hydroxy carboxylic acids thus produce their effects at the end of the electrodeposition process when the trenches and/or the vias are almost totally filled.

The possibility of depositing cobalt, at pH values below 4, using alpha-hydroxy carboxylic acids in a conformal cobalt electrodeposition process has never been suggested, which makes the results of the invention all the more surprising.

GENERAL DESCRIPTION OF THE INVENTION

Thus, the invention relates to an electrolyte for the electrodeposition of cobalt in the form of an aqueous solution with a pH of between 2.0 and 4.0 containing cobalt II ions, chloride ions, and at most two non-polymer organic additives, for example just one alpha-hydroxy carboxylic acid or two alpha-hydroxy carboxylic acids.

The term "polymer" is intended to mean a compound comprising at least two repeating units in its chemical formula.

The invention also relates to a process for filling cavities with cobalt by means of a conformal deposition mechanism, which uses the preceding electrolyte.

The electrolyte and the process of the invention make it possible to obtain continuous cobalt deposits of high purity, and in a production time compatible with industrial applications, which may be reduced compared with those of the prior art. This is because the processes used to create conductive lines of cobalt implement two distinct cobalt electrodeposition steps: a first electrodeposition step using a first electrolyte comprising cobalt ions for filling the cavities, and a second electrodeposition step using a second electrolyte comprising cobalt ions for depositing the "overburden" layer over the whole of the surface of the substrate. Moreover, the substrate must be rinsed and dried at the end of the first electrodeposition step, before the second step is carried out. The process of the invention advantageously makes it possible to carry out the filling of the cavities and the deposition of the overburden layer in a single electrodeposition step.

Moreover, the cobalt deposits produced in the context of the invention have the advantage of being of very high purity.

The prior art processes for the creation of cobalt interconnections use alkaline electrolytes, for example with a pH above 9, by applying very low current densities, and also cobalt-specific suppressor compounds, so that the pH inside the trenches remains above 4 throughout the filling step, which leads to a substantial formation of cobalt hydroxide in the cobalt deposit obtained, which cobalt hydroxide decreases the conductivity of the cobalt interconnections and decreases the performances of the integrated circuits.

An electrodeposition process which can be carried out using the electrolyte of the invention follows a conformal filling mode, so that the organic additives used in large amounts in the bottom-up filling processes of the prior art and which generate contaminations are not necessary.

Subsequently, working in a pH range below 4.0 has the advantage of limiting the formation of cobalt hydroxide, and makes it possible to dispense with a buffer compound such as boric acid, which is however described in the prior art as being necessary to stabilize the pH value during the polarization phase of the processes using alkaline electrolytes. However, boric acid, very commonly used to perform this function, breaks down into boron derivatives which contaminate the cobalt deposit. The contamination is all the more significant since the concentration of the buffer compound in the electrolytes must be high in order to stabilize the pH of the electrolyte during the electrodeposition.

The electrolyte and the process of the invention thus make it possible to considerably limit the contamination of the cobalt deposit by limiting the concentration of organic molecules such as buffer substances, and the formation of cobalt hydroxide during the electrodeposition.

The electrolyte of the invention also has the advantage of generating cobalt lines or vias which do not contain voids.

Moreover, the electrolyte and the process of the invention make it possible to obtain cobalt interconnections which have a very low content of impurities, preferably less than 1000 ppm atomic, while at the same time being formed at a faster deposition speed.

Definitions

The term "electrolyte" is intended to mean the liquid containing precursors of a metal coating used in an electrodeposition process.

The term "continuous filling" is intended to mean a mass of cobalt free of voids. In the prior art, holes or voids of material can be observed in a cobalt deposit between the walls of the patterns and the cobalt deposit ("sidewall voids"). Voids located at equal distance from the walls of the patterns can also be observed in the form of holes or lines ("seams"). These voids can be observed and quantified by transmission or scanning electron microscopy, by making cross sections of the deposits. The continuous deposit of the invention preferably has an average void percentage of less than 10% by volume, preferably less than or equal to 5% by volume. The measurement of the void percentage inside the structures to be filled can be carried out by electron microscopy at a magnification between 50 000 and 350 000.

The term "average diameter" or "average width" of the cavities is intended to mean dimensions measured at the opening of the cavities to be filled. The cavities are for example in the form of tapered channels or cylinders.

The term "conformal filling" is intended to mean a filling mode in which the cobalt deposit grows at the same speed at the bottom and on the walls of the hollow patterns. This filling mode is in contrast to filling from the bottom to the top (termed "bottom-up") in which the speed of deposition of the cobalt is faster at the bottom of the cavities.

The term "buffer substance" or "buffer compound" is intended to mean a compound which is part of the composition of an electrolyte comprising cobalt ions and chloride ions and the pH of which ranges from 2.0 to 4.0. This compound is used in an amount sufficient to stabilize the pH of the electrolyte to within ±0.3 and preferably to within ±0.2, after it has been brought into contact with the conductive surface of a substrate to be covered with cobalt metal during the electrical step of the electrodeposition process. Thus, a compound may be a buffer substance at a given concentration in a given electrolyte and no longer be a buffer substance in the same electrolyte if its concentration is not sufficient to avoid the pH variations of the electrolyte during the electrical step. The expression "substance in an amount sufficient to exert a buffer effect" may also be used.

FIGURES

Figure 2:
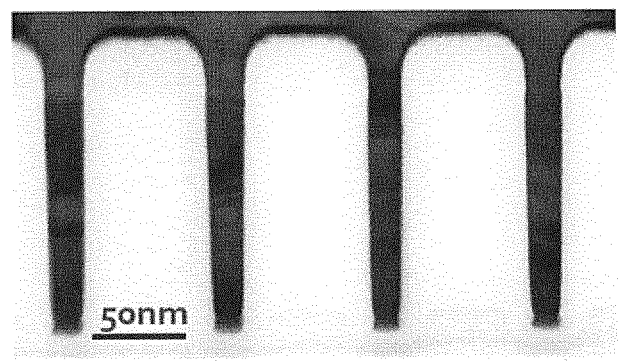

FIGS. 1 and 2 are transmission electron microscopy images of cavities filled according to a process of the invention (examples 1 and 2).

Figure 3:
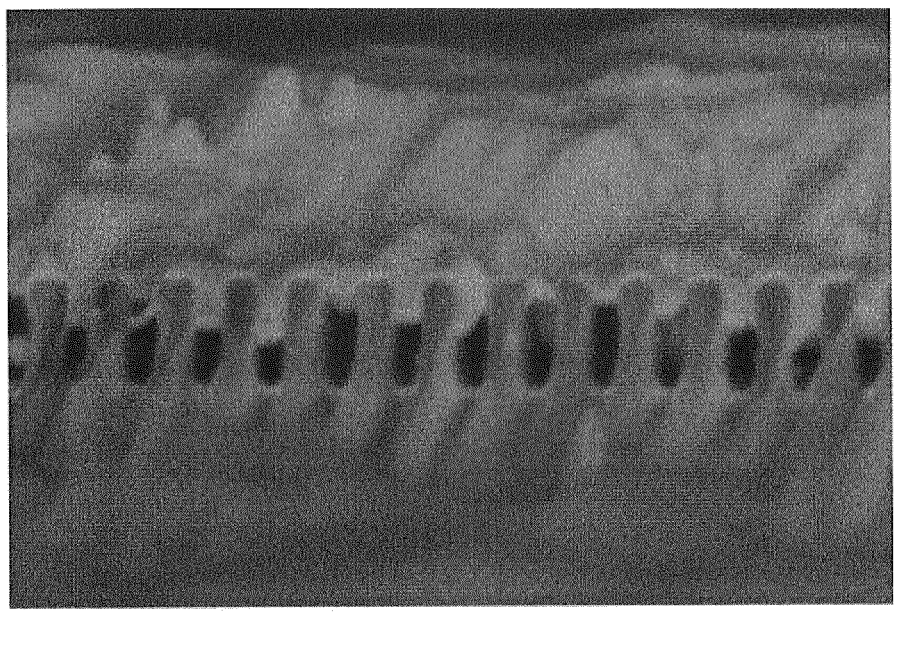

FIG. 3 is a scanning electron microscopy image of cavities filled according to an electrodeposition process of the prior art (comparative example 3).

DETAILED DESCRIPTION OF THE INVENTION

According to a first embodiment, the invention relates to an electrolyte for electrodeposition of cobalt comprising, in aqueous solution, cobalt II ions, chloride ions, an acid in an amount sufficient to obtain a pH of between 1.8 and 4.0, for example between 2.0 and 4.0, and at most two organic additives, preferably just one or at most two organic additives, at least one of them being chosen from alpha-hydroxy carboxylic acids, which preferably do not comprise sulfur.

In particular, the invention relates to an electrolyte for the electrodeposition of cobalt, characterized in that the electrolyte is an aqueous solution comprising from 1 to 5 g/l of cobalt II ions, from 1 to 10 g/l of chloride ions, an acid in an amount sufficient to obtain a pH of between 1.8 and 4.0, for example between 2.0 and 4.0, and at most two organic additives, said organic additives not being polymers and preferably not comprising sulfur, at least one of them, or even both, preferably being an alpha-hydroxy carboxylic acid.

The electrolyte preferably comprises at most one organic additive, which may be a non-sulfur-comprising alpha-hydroxy carboxylic acid.

The organic additive(s) preferably have a molecular weight of less than 250 g/mol, preferably less than 200 g/mol, and greater than 50 g/mol, more preferably greater than 100 g/mol.

The concentration of the additive or the sum of the concentrations of the two additives is preferably between 5 and 200 mg/l. In this embodiment, the additives may each be a non-sulfur-comprising alpha-hydroxy carboxylic acid.

The weight concentration of cobalt II ions can range from 1 g/l to 5 g/l, for example from 2 g/l to 3 g/l. That of the chloride ions can range from 1 g/l to 10 g/l.

A relatively high cobalt ion concentration at a very acidic pH has several advantages compared with the prior art electrolyte baths of basic or slightly acidic pH which are less concentrated in terms of cobalt ions.

Indeed, the inventors have discovered that it is not necessary to work at a pH above 4 in order to limit the corrosion of the cobalt deposit, contrary to what is taught in the prior art. By increasing the concentration of cobalt ions and decreasing the pH value, it is probably possible, without being bound by any theory, to stabilize the deposit of cobalt metal by substantially increasing the concentration of the cobalt ions present in the aqueous solution. The inventors have thus observed a deposition speed which is faster than that of the prior art, and also a large size of the cobalt grains in the deposit, typically greater than 100 nm.

The chloride ions can be provided by dissolution, in water, of cobalt chloride or of a hydrate thereof, such as cobalt chloride hexahydrate.

The composition is preferably not obtained by dissolution of a cobalt salt such as cobalt sulfate or a hydrate thereof, since it generates a sulfur-comprising contamination of the cobalt deposit, which it is desirable to avoid.

The organic additive(s) preferably do not comprise sulfur, and are preferably chosen from alpha-hydroxy carboxylic acids, such as citric acid, tartaric acid, glycolic acid, lactic acid, malic acid, mandelic acid, maleic acid, oxalic acid and 2-hydroxybutyric acid compounds.

The additional organic compound may be of any nature provided that it does not cause a bottom-up filling effect. The compound may have various functions, such as those of an accelerator, a suppressor, a growth promoter or a leveller, but the electrolyte of the invention is advantageously devoid thereof. For example, the electrolyte of the invention is devoid of suppressor polymers, in particular polymers such as polyethylene glycols, polyvinylpyrrolidones or polyethyleneimines.

The hydroxylated carboxylate is for example the tartrate, and the electrolyte preferably comprises at most one organic additive.

In the electrolyte of the invention, preferably before the polarization and during the polarization, the cobalt II ions are advantageously in free form, that is to say not complexed with the organic additive(s), such organic additives possibly being for example an alpha-hydroxy carboxylic acid, glycine or ethylenediamine.

Not having a substantial amount of complex of cobalt with an organic molecule has many advantages: it makes it possible to decrease the organic contamination of the deposit of cobalt metal since the concentration of organic molecules in the bath can be very low; it also makes it possible to avoid—throughout the deposition of the cobalt in the structures—any uncontrolled variation in the pH that may destabilize the solution. Moreover, the cobalt ions are not stabilized by the complex and can be more easily reduced so that the speed of deposition of the cobalt is faster. Finally, the very high concentration of cobalt ions protects the surface of the conductive surface of the cavities against corrosion. This effect is determining when the substrate is covered with a layer of cobalt of very small thickness (seed layer).

When the organic additive or the two organic additives are alpha-hydroxy carboxylic acids and the pH of the electrolyte is below 4.0, the additives do not complex with the cobalt ions.

In the cavities to be filled in the context of the process of the invention, a distinction can be made between a flat part and several hollows on the flat part. One of the objectives pursued in the prior art is to slow down the deposition of the cobalt on the flat part using suppressors which specifically adsorb onto the flat surface of the substrate, without penetrating into the hollows of the patterns. They will be referred to as surface suppressors in the present description.

The electrolyte of the present invention advantageously comprises one of the following features, taken alone or in combination:
  It does not comprise an accelerator of cobalt growth at the bottom of the patterns,
  The electrolyte does not contain an organic suppressor molecule capable of slowing down the growth of the cobalt on the flat part of the substrate at the opening of the cavities, by specifically adsorbing onto the cobalt which is deposited at this site during the electrodeposition,
  It comprises no polymer,
  It does not comprise a sulfur-comprising compound,
  It does not comprise a buffer compound, such as for example boric acid, useful in an alkaline medium,
  It does not comprise a combination of additives which bring about a bottom-up filling mechanism, in particular the combination of a suppressor and an accelerator, or the combination of a suppressor, an accelerator and a leveller.

Among the surface suppressors, mention may be made of the following compounds: carboxymethylcellulose, nonylphenolpolyglycol ether, polyethylene glycol dimethyl ether, octanediol bis(polyalkylene glycol ether), octanol polyalkylene glycol ether, polyglycolic ester of oleic acid, poly(ethylene glycol-propylene glycol), polyethylene glycol, polyethyleneimine, polyethylene glycol dimethyl ether, polyoxypropylene glycol, polypropylene glycol, polyvinyl alcohol, polyglycolic ester of stearic acid, polyglycolic ether of stearyl alcohol, butyl alcohol/ethylene oxide/propylene oxide copolymers, 2-mercapto-5-benzimidazolesulfonic acid, 2-mercaptobenzimidazole.

An accelerator is generally a compound comprising a sulfur atom, for example the (3-sulfopropyl) of N,N-dimethyldithiocarbamic acid, the (3-sulfopropyl) ester of 3-mercaptopropylsulfonic acid, 3-sulfanyl-1-propane sulfonate, the ester of dithiocarbonic acid o-ethyl ester s-ester with the potassium salt of 3-mercapto-1-propanesulfonic acid, bis-sulfopropyl disulfide, a sodium salt of 3-(benzothiazolyl-s-thio)propylsulfonic acid, pyridinium propylsulfobetaine, 1-sodium-3-mercaptopropane-1-sulfonate, the (3-sulfoethyl) ester of N,N-dimethyl-dithiocarbamic acid, the (3-sulfoethyl) ester of 3-mercaptoethylpropylsulfonic acid, a sodium salt of 3-mercaptoethylsulfonic acid, pyridinium ethylsulfobetaine or thiourea.

In the first embodiment, the pH of the electrolyte is preferably between 2.0 and 4.0. In one particular embodiment, the pH is between 2.0 and 3.5, or between 2.0 and 2.4, or between 2.5 and 3.5, or else between 2.8 and 3.2.

The pH of the composition may optionally be adjusted with a base or an acid known to those skilled in the art. The acid used may be hydrochloric acid.

In one preferred embodiment of the invention, the electrolyte comprises less than 500 ppm of a buffer compound (having at least 1 pKa) capable of preventing pH variations of the electrolyte during the polarization step of an electrodeposition process. The concentration of the buffer compound in the electrolyte is preferably less than 400 ppm, 300 ppm or even 250 ppm. During the electrical step, the pH of the electrolyte can be readjusted, if necessary, for isolated additions of an acid, such as hydrochloric acid for example.

However, in one preferred embodiment of the invention, the electrolyte does not contain a buffer substance in significant amount.

Although there is no restriction of principle on the nature of the solvent (provided that it sufficiently dissolves the active species of the solution and does not interfere with the electrodeposition), it will preferably be water. According to one embodiment, the solvent comprises mainly water by volume.

According to a second embodiment, the invention relates to an electrolyte for the electrodeposition of cobalt, having a pH of between 1.8 and 4.0, for example between 2.0 and 4.0, and comprising, in aqueous solution, cobalt II ions, chloride ions and between 5 and 200 mg/l of one or more compounds having at least 1 pKa ranging from 1.8 to 3.5, preferably ranging from 2.0 to 3.5, and more preferably ranging from 2.2 to 3.0.

This second embodiment may comprise the following features.

The compound preferably has a molecular weight of less than 250 g/mol, preferably less than 200 g/mol, and greater than 50 g/mol, preferably greater than 100 g/mol.

The compound having at least 1 pKa value ranging from 2.0 to 3.5 may, in certain cases, be identical to at least one of the organic additives used in the first embodiment. It may in particular be chosen from citric acid, tartaric acid, malic acid, maleic acid and mandelic acid.

It may also be chosen from the compounds fumaric acid (pKa=3.03), glyceric acid (pKa=3.52), orotic acid (pKa=2.83), malonic acid (pKa=2.85), L-alanine (pKa=2.34), phosphoric acid (pKa=2.15), acetylsalicylic acid (pKa=3.5) and salicylic acid (pKa=2.98).

The prior art processes for filling with cobalt use alkaline electrolytes, for example with a pH above 9, while applying very low current densities, and cobalt-specific suppressor compounds, so that the pH inside the trenches remains above 4 throughout the filling step, which leads to a substantial formation of cobalt hydroxide in the cobalt deposit obtained, which cobalt hydroxide decreases the conductivity of the cobalt interconnections and decreases the performances of the integrated circuits.

The electrolyte of the invention and the process of the invention aim precisely to solve this problem, by considerably limiting the formation of cobalt hydroxide in such a way that it is present only in trace amounts in the cobalt that has been deposited. The solution to this problem consists in using an electrolyte of which the pH is between 1.8 and 4.0, for example between 2.0 and 4.0, and to which is added an additive which preferably has at least one, or even all, of the features such as:
- a buffering capacity which makes it possible to maintain the pH of the electrolyte throughout the polarization of the substrate at a value above 1.8 or 2.0 and below 3.5, and preferably below 2.5,
- a low molecular weight such that the additive can diffuse in the structures with a small opening diameter, and
- a very low concentration in the electrolyte, such that the amount of additive present in the electrolyte before the beginning of the polarization diffuses almost totally in the cavities of the structures, and that the additive has a local buffering capacity.

An electrolyte comprising such an additive makes it possible to limit in a selective manner—for example only in the cavities of the structures and not at the flat surface of the substrate—an increase in the pH at a value below 4.0, preferably below 3.0 and more preferably at a value of between 2.0 and 2.5. The additive can thus advantageously perform the function of a buffering agent, by exerting its effect locally, i.e. only in the cavities. The organic additive or the compound having at least 1 pKa ranging from 1.8 to 3.5 or from 2.0 to 3.5 can act as a local buffering agent, the effect of which is observed only in the cavities.

This second embodiment may comprise other features, which may correspond to some of the features of the first embodiment of the invention which were described above.

The invention also relates to an electrochemical process for filling cavities, said process comprising:
- a step of bringing a conductive surface of said cavities into contact with one of the electrolytes as described above, and
- a step of polarizing the conductive surface for a period of time sufficient for complete filling of the cavities by cobalt deposition to be obtained, this filling preferably being conformal.

The process preferably comprises a step of annealing the cobalt deposit obtained at the end of the polarization step.

The invention may also relate to an electrochemical process for the deposition of cobalt on a substrate comprising a conductive surface inside cavities hollowed out in the substrate and a conductive surface outside the cavities, said process comprising:
- a step of bringing said conductive surfaces into contact with an electrolyte in the form of an aqueous solution with a pH of between 2.0 and 4.0 comprising cobalt II ions, chloride ions, and just one or at most two organic additives, said organic additives not being polymers,
- a step of polarizing said conductive surfaces for a period of time sufficient to carry out the filling of the cavities with cobalt, and also to deposit a layer of cobalt at least 50 nm thick on the conductive surface outside the cavities,
- a step of annealing the cobalt obtained at the end of the polarization step.

The layer of cobalt, also called overburden layer, can have a thickness of between 20 nm and 300 nm. It advantageously has a constant thickness over the entire surface of the substrate outside the cavities. The layer is also uniform, shiny and compact. Its degree of purity is preferably less than 1000 ppm atomic.

The process of the invention can be carried out with one of the electrolytes described above, comprising one or two non-polymer organic additives according to the first embodiment, or comprising between 5 and 200 mg/l of one or more compounds having at least 1 pKa ranging from 1.8 to 3.5, preferably ranging from 2.0 to 3.5, and more preferably ranging from 2.2 to 3.0.

The electrolyte used in the context of the process of the invention can correspond to the electrolyte of the first embodiment or the second embodiment described above.

Throughout the implementation of the filling step of the process of the invention, the pH inside the cavities advantageously remains below 3.5, or even below 3.0 depending on the nature of the electrolyte used.

The cavities can be designed in the context of the implementation of a Damascene or Dual-Damascene process. The cavities can in particular be obtained by carrying out the following steps:
- a step of etching structures in a silicon substrate,
- a step of forming a layer of silicon oxide on a silicon surface of the structures so as to obtain a silicon oxide surface,
- a step of depositing a layer of metal on said layer of silicon oxide, so as to obtain a conductive surface of the cavities.

The layer of metal has for example a thickness of between 1 and 10 nm. It is preferably deposited on a layer of silicon oxide, which is in contact with the silicon.

The process of the invention is a conformal process as opposed to the "bottom-up" or "super conformal" processes of the prior art. In the conformal filling process of the invention, the cobalt deposit grows at the same speed at the bottom and on the walls of the hollow patterns to be filled. This filling mode is in contrast to the other processes of the prior art in which the speed of deposition of the cobalt is faster at the bottom of the cavities than on the walls of the cavities.

The electrodeposition process of the invention can use the bath which is the subject of the first aspect of the invention described above. All the features that were described in relation to the first aspect of the invention apply to the electrodeposition process.

The content of total impurities of the cobalt deposit obtained by means of the electrodeposition process of the invention is less than 1000 ppm atomic. Among the impurities are mainly oxygen, followed by carbon and nitrogen. The total content of carbon and nitrogen is less than 300 ppm. The cobalt deposit is advantageously continuous. It preferably has an average void percentage of less than 10% by volume or by surface area, preferably less than or equal to 5% by volume or by surface area. The void percentage in the cobalt deposit can be measured by electron microscopy observation known to those skilled in the art, who will select the method that appears to them to be the most suitable. One of these methods may be scanning electron microscopy (SEM) or transmission electron microscopy (TEM) using a magnification of between 50 000 and 350 000. The void volume can be evaluated by measuring the void surface area observed on one or more cross sections of the substrate comprising the cavities filled. In the case of the measurement of several surface areas on several cross sections, the average of these surface areas will be calculated in order to evaluate the void volume.

The electrodeposition step is generally stopped when the cobalt deposit covers the flat surface of the substrate: in this case, the cobalt deposit comprises the cobalt deposit which is inside the cavities and the layer of cobalt which covers the surface of the substrate in which the cavities were hollowed out. The thickness of the layer of cobalt which covers the surface can be between 50 nm and 250 nm, and can for example be between 125 nm and 175 nm.

A low content of impurities combined with a very low percentage of voids makes it possible to obtain a cobalt deposit with a lower resistivity.

The cobalt deposition speed is between 0.1 and 3.0 nm/s, preferably between 1.0 and 3.0 nm/s, and more preferably between 1 and 2.5 nm/s.

The through-vias and the interconnections can be made according to the Damascene or Dual-Damascene process known to those skilled in the art, comprising a succession of steps comprising: —the etching of the patterns in or through the silicon wafer in a main axis perpendicular to the surface of the wafer in order to obtain patterns with a vertical profile forming hollows; —the depositing of an insulating dielectric layer generally consisting of silicon oxide; —the depositing of a layer of a material that serves to prevent the migration of the cobalt in the silicon; —the optional depositing of a thin metallic layer, called seed layer; —the filling of the patterns by electrodeposition of cobalt; and—the removal of the excess cobalt by polishing.

The lines of conductive cobalt can be created at the front (FEOL line) or at the back (BEOL line) of the semiconductor device metallization structure.

It is possible to use a silicon substrate which has been etched according to the desired patterns and subsequently covered with a layer of silicon oxide and then with a metallic layer which may be a seed layer of a metal, a barrier layer to the diffusion of the cobalt, a liner or a combination of at least two of the above. The metallic layer may have a thickness of between 1 nm and 10 nm, for example between 2 nm and 5 nm, and may comprise for example a single layer or several superimposed layers of various materials.

The conductive surface of the patterns is a surface of a layer of metal comprising at least one compound chosen from the group consisting of cobalt, copper, tungsten, titanium, tantalum, ruthenium, nickel, titanium nitride and tantalum nitride. In one particular embodiment, the conductive surface is a cobalt surface.

The metallic layer may thus comprise a layer of tantalum nitride TaN having a thickness of between 1 nm and 6 nm, itself covered and in contact with a layer of cobalt metal having a thickness of between 1 nm and 10 nm, preferably between 2 nm and 5 nm, on which the cobalt is deposited during the electrical step.

The resistivity of the assembly comprising the metallic layer and the cobalt deposit can range from 7 to 10 ohm/cm. It is preferably between 7.5 and 8.5 ohm/cm.

The cavities intended to be filled with cobalt according to the process of the invention preferably have a width or a diameter at their opening at the level of the surface of a substrate in which they were created of between 10 nm and 200 nm or between 10 nm and 100 nm, preferably between 10 and 40 nm, and more preferably between 15 nm and 30 nm. Their depth may range from 50 to 250 nm. According to one embodiment, they have a width of between 10 nm and 30 nm and a depth of between 125 nm and 175 nm.

It has been demonstrated that the electrolyte of the invention makes it possible to fill very thin trenches or small vias which have a width or a diameter at the opening of less than 40 nm, this being at a speed greater than that of the prior art processes and according to conformal filling. The electrolyte also makes it possible to obtain a continuous cobalt mass without voids of material and the content of impurities, such as cobalt hydroxide, of which is very low.

The intensity of the polarization used in the electrical step preferably ranges from $2\ mA/cm^2$ to $20\ mA/cm^2$, whereas it generally ranges from $0.2\ mA/cm^2$ to $1\ mA/cm^2$ in the prior art processes in which an alkaline electrolyte is used.

The electrical step of the process of the invention may comprise just one or several polarization steps, of which those skilled in the art will be able to choose the variables on the basis of their general knowledge.

The electrical step can be carried out using at least one polarization mode chosen from the group consisting of the ramp mode, the galvanostatic mode and the galvano-pulsed mode.

The electrical step may thus comprise at least one step of electrodeposition in galvano-pulsed mode and at least one step of electrodeposition in galvanostatic mode, the electrodeposition step in galvanostatic mode preferably following the electrodeposition step in galvano-pulsed mode.

For example, the electrical step comprises a first step of polarization of the cathode in galvano-pulsed mode alternating a current ranging from $3\ mA/cm^2$ to $20\ mA/cm^2$, for example from $12\ mA/cm^2$ to $16\ mA/cm^2$, for a time ($T_{on}$) preferably of between 5 and 50 ms, and a zero polarization for a time ($T_{off}$) preferably of between 50 and 150 ms.

In this first step, the substrate can be brought into contact with the electrolyte either before the polarization, or after the polarization. It is preferred for the bringing into contact with the cavities to be carried out before applying voltage, so as to limit the corrosion of the metal layer which comes into contact with the electrolyte.

In a second step, the cathode can be polarized in galvanostatic mode with a current ranging from $3\ mA/cm^2$ to $20\ mA/cm^2$. The two steps preferably have substantially equal durations.

The second step in galvanostatic mode can itself comprise two steps: a first step in which the current has an intensity ranging from $3\ mA/cm^2$ to $8\ mA/cm^2$ and a second step in which a current with an intensity ranging from $9\ mA/cm^2$ to $20\ mA/cm^2$ is applied.

This electrical step can in particular be used when the electrolyte has a pH of between 2.5 and 3.5.

According to another example, the electrical step comprises a first step of polarization of the cathode in ramp mode with a current which goes preferably from $0\ mA/cm^2$ to $15\ mA/cm^2$, preferably from $0\ mA/cm^2$ to $10\ mA/cm^2$, followed by a step in galvanostatic mode by applying a current ranging from 10 mA/cm$^2$ to 20 mA/cm$^2$, preferably ranging from 8 mA/cm$^2$ to 12 mA/cm$^2$. This electrical step can be used in particular when the electrolyte has a pH of between 2.0 and 2.5.

The process of the invention preferably comprises a step of annealing the cobalt deposit obtained at the end of filling described above.

This annealing heat treatment can be carried out at a temperature of between 350° C. and 550° C., for example of about 450° C., preferably under a reducing gas such as $H_2$ at 4% in $N_2$.

The process may comprise a preliminary step of treatment by reducing plasma so as to reduce the native metal oxide present at the surface of the substrate. The plasma also acts on the surface of the trenches, thereby making it possible to improve the quality of the interface between the seed layer and the electrodeposited cobalt. It is preferable for the subsequent electrodeposition step to be carried out immediately after the plasma treatment in order to minimize the reformation of native oxide.

The present application describes moreover an electrochemical process for conformal filling of cavities, comprising:
  a step of bringing a conductive surface of said cavities into contact with an aqueous solution having a pH of between 2.0 and 4.0 comprising cobalt II ions, chloride ions and at most two organic additives, including an alpha-hydroxy carboxylic acid, and
  a step of polarizing said conductive surface in order to fill the cavities with cobalt according to a conformal filling mode.

The alpha-hydroxy carboxylic acid preferably diffuses inside the cavities owing to its small size.

This process can satisfy one or more of the features that were previously described with regard to the electrochemical process of the invention.

The process of the invention can in particular be used in the fabrication of semi-conductor devices during the creation of conductive metal interconnections such as trenches running along the surface and vias connecting various levels of integration.

The invention is further illustrated by the following exemplary embodiments.

Example 1: Electrodeposition at pH=3.0 for Structures 26 nm Wide and 150 nm Deep and with an Organic Additive Trenches 26 nm wide and 150 nm deep were filled with cobalt by electrodeposition on a cobalt seed layer. The deposition is carried out using a composition containing cobalt dichloride and an alpha-hydroxy carboxylic acid at pH 3.0. Finally, the substrates are heat-treated in order to improve the quality of the metal deposited.

A. Material and Equipment

Substrate:
The substrate used in this example consisted of a silicon coupon of 4×4 cm. The silicon is covered with silicon oxide in contact with a layer of TaN which is 4 nm thick, itself covered and in contact with a layer of cobalt metal which is 3 nm thick. The trenches to be filled thus have a width of 26 nm and a depth of 150 nm. The measured resistivity of the substrate of which the cavities are filled with cobalt is approximately 300 ohm/square.

Electrodepositing Solution:
In this solution, the $Co^{2+}$ concentration is equal to 2.47 g/l obtained from $CoCl_2(H_2O)_6$. The tartaric acid has a concentration of from 5 to 200 ppm, for example equal to 15 ppm. The pH of the solution is adjusted to pH=3.0 by means of the addition of hydrochloric acid.

Equipment:
In this example, use was made of electrolytic deposition equipment composed of two parts: the cell intended to contain the electrodepositing solution, equipped with a fluid recirculation system in order to control the hydrodynamics of the system, and a rotating electrode equipped with a sample holder suitable for the size of the coupons used (4 cm×4 cm). The electrolytic deposition cell comprised two electrodes:
  a cobalt anode,
  the structured silicon coupon coated with the layer described above which constitutes the cathode,
  the reference being connected to the anode.

Connectors enabled the electrical contacting of the electrodes, which were connected by electrical wires to a potentiostat supplying up to 20 V or 2 A.

B. Experimental Protocol

Preliminary Step:
A short treatment by $H_2$ plasma (0.5 mbar, 70 W, 5 min) is carried out on the silicon sample so as to reduce the native cobalt oxide present on the substrate.

Electrical Process:
The process is carried out in three steps:
  a) In the first step, the cathode was polarized in galvanopulsed mode in a current range of from 30 mA (or 3.8 mA/cm$^2$) to 150 mA (or 19 mA/cm$^2$), for example 110 mA (or 14 mA/cm$^2$) with a pulse time of between 5 and 50 ms in cathodic polarization, and between 50 and 150 ms in zero polarization between two cathodic pulses. This step was performed with a rotation of 50 rpm for 50 seconds. The electrolyte is brought into contact with the substrate before applying voltage.
  b) In the second step, the cathode was polarized in galvanostatic mode in a current range of from 30 mA (or 3.8 mA/cm$^2$) to 60 mA (or 7.6 mA/cm$^2$), for example a current of 55 mA (or 7 mA/cm$^2$). This step was performed with a rotation of 100 rpm for 20 seconds.
  c) During the final step, the cathode was polarized in galvanostatic mode in a current range of from 80 mA (or 10 mA/cm$^2$) to 150 mA (or 19 mA/cm$^2$), for example 110 mA (or 13.75 mA/cm$^2$). This step was performed with a rotation of 100 rpm for 30 seconds.

After these three successive electro-grafting steps, complete filling of the structures with a high aspect ratio with deposition of a thick layer of cobalt above is obtained in 100 s.

Annealing Step:
Annealing at 500° C. under reducing gas ($H_2$ at 4% in $N_2$, called forming gas) is carried out for 10 minutes.

C. Results Obtained

An analysis by transmission electron microscopy (Mag=320 k, EHT=100 kV), carried out after annealing, reveals defect-free filling of holes on the walls of the trenches ("sidewall voids") reflecting good nucleation of the cobalt, and no hole in the structures ("seam-voids") reflecting an annealing which eliminates defects of this type (see FIG. 1). The thick layer of cobalt of 150 nm on the structures has a resistivity of 8.0 Ohm·cm.

The content of total impurities of the cobalt deposit obtained is equal to 790 ppm atomic. The total content of carbon and nitrogen is equal to 200 ppm.

The cobalt deposition speed is equal to 1.5 nm/s.

Example 2: Electrodeposition at pH=3.0 for Structures 16 nm Wide and 150 nm Deep and with an Organic Additive Trenches, more aggressive than in example 1, 16 nm wide and 150 nm deep, were filled with cobalt by electrodeposition on a cobalt layer. The deposition is still carried out using a composition containing cobalt dichloride and tartaric acid at pH 3.0. The substrates are still heat-treated in order to improve the quality of the metal deposited.

A. Material and Equipment

Substrate:
The substrate used in this example was obtained from a silicon coupon of 4×4 cm. The silicon is covered with silicon oxide in contact with a layer of TaN which is 4 nm thick, itself covered and in contact with a layer of cobalt metal which is 3 nm thick. The trenches to be filled thus have a width of 16 nm and a depth of 150 nm. The measured resistivity of the substrate is approximately 170 ohm/square.
Electrodepositing Solution:
The solution is identical to that of example 1.
Equipment:
The equipment is identical to that of example 1.

B. Experimental Protocol

Preliminary Step:
The plasma treatment is identical to that of example 1.
Electrical Process:
It is as described in example 1; the process is carried out in this case also in three steps and is exactly identical.
Annealing Step:
The annealing step is strictly identical to that of example 1.

C. Results Obtained

An analysis by transmission electron microscopy (Mag=320 k, EHT=100 kV), carried out after annealing, reveals defect-free filling of holes on the walls of the trenches ("sidewall voids") reflecting good nucleation of the cobalt, and no hole in the structures ("seam-voids") reflecting an annealing which eliminates defects of this type (see FIG. 2). The thick layer of cobalt of 150 nm on the structures has a resistivity of 8.5 Ohm·cm.

When the same process is carried out at a pH equal to 3.0, the content of total impurities of the cobalt deposit obtained is equal to 790 ppm atomic. The total content of carbon and nitrogen is equal to 200 ppm.

The cobalt deposition speed is equal to 1.5 nm/s.

Comparative Example 3: Electrodeposition at pH=5.3 with Structures 26 nm Wide and 150 nm Deep and with an Organic Additive Trenches 26 nm wide and 150 nm deep were filled with cobalt by electrodeposition on a cobalt seed layer. The deposition is carried out using a composition containing cobalt dichloride hydrate and tartaric acid at pH 5.3. Finally, the substrates are heat-treated in order to improve the quality of the metal deposited.

A. Material and Equipment

Substrate:
The substrate used is strictly identical to that of example 1.
Electrodepositing Solution:
In this solution, the $Co^{2+}$ concentration is equal to 2.47 g/l obtained from $CoCl_2(H_2O)_6$. The tartaric acid has a concentration of from 5 to 200 ppm, for example equal to 15 ppm. The pH of the solution is adjusted to pH=5 by means of the addition of hydrochloric acid.
Equipment:
The equipment is identical to that of example 1.

B. Experimental Protocol

Electrical Process:
As described in example 1, the process is carried out in this case also in three steps and is exactly identical.
Annealing Step:
The annealing step is strictly identical to that of example 1.

C. Results and Discussion

An analysis by scanning microscopy (Mag=100 k, WD=2.2 nm, Signal A=ESB, EHT=2.0 kV) of the substrate reveals filling of poor quality with many hole defects of the "seam-voids" type which are visible in black in FIG. 3.

These results underline the need to use a pH below 4 in order to obtain good electrodeposition with the solution used.

The layer of cobalt 150 nm thick on the surface of the substrate has a resistivity of 9.0 Ohm·cm.

Example 4: Electrodeposition at pH=2.2 for Structures 16 nm Wide and 150 nm Deep and with an Organic Additive Trenches 16 nm wide and 150 nm deep were filled with cobalt by electrodeposition on a cobalt seed layer. This example differs from example 2 by virtue of the conditions of the electrical step and its pH.

A. Material and Equipment

Substrate:
The substrate is identical to that of example 2.
Electrodepositing Solution:
The solution is identical to that of example 1, but the pH is adjusted to 2.2.
Equipment:
The equipment is identical to that of example 1.

B. Experimental Protocol

Preliminary Step:
The plasma treatment is identical to that of example 1.
Electrical Process:
The process is carried out in two steps:
a) In the first step, the cathode was polarized in galvanodynamic ramp mode wherein the current changes proportionally with the time from a value greater than or equal to 0 mA to reach a maximum value of 110 mA (or 13.75 mA/cm$^2$). In this example, the current changes from 0 mA to 80 mA (or 10 mA/cm$^2$) with a rate of 1.33 mA/sec. This step was performed with a rotation of 50 rpm for 60 seconds.

b) During the second step, the cathode was polarized in galvanostatic mode in a current range of from 80 mA (or 10 mA/cm$^2$) to 150 mA (or 19 mA/cm$^2$), for example 80 mA (or 10 mA/cm$^2$). This step was performed with a rotation of 50 rpm for 40 seconds.

After these two successive steps, complete filling of structures having a high aspect ratio, and also the formation of a layer of cobalt on the flat surface of the substrate, are obtained in 100 s.

Annealing Step:

Annealing at 450° C. under a reducing gas (H$_2$ at 4% in N$_2$, called forming gas) is carried out for 5 minutes by means of a rapid thermal annealing process.

C. Results Obtained

A TEM analysis carried out after annealing reveals defect-free filling of holes on the walls of the trenches ("sidewall voids") reflecting good nucleation of the cobalt, and no hole in the structures ("seam-voids") reflecting an annealing which eliminates defects of this type. The thick layer of cobalt of 150 nm on the structures has a resistivity of 7.5 Ohm·cm.

The cobalt deposition speed is equal to 1.9 nm/s.

Comparative Example 5: Electrodeposition at pH=8.0 with Trenches 22 nm Wide and 75 nm Deep and an Organic Additive Trenches 22 nm wide and 75 nm deep, which have a free surface of copper obtained by deposition of a layer of copper on the substrate, were filled with cobalt. The trenches were filled using a composition based on triethylenetetramine present in a stoichiometric amount with the cobalt for a ratio of 1 to 1.

A. Material and Equipment

Substrate:

The substrate used in this example consisted of a silicon coupon having a length of 4 cm and a width of 4 cm, covered with a layer of structured silicon oxide having trenches 22 nm wide and 75 nm deep. The silicon oxide is covered and in contact with a layer of cobalt 2 nm thick, itself covered and in contact with a layer of copper less than 4 nm thick. The resistivity of the layer of copper is 250 ohm/square.

Electrodepositing Solution:

In this solution, the concentration of triethylenetetramine present in a stoichiometric amount with the cobalt is 1.32 g/l (from a commercial solution at 60%). The concentration of CoSO$_4$(H$_2$O)$_6$ is equal to 1.5 g/l (i.e. a Co$^{2+}$ concentration of 0.31 g/l).

Thioglycolic acid was also added in a concentration equal to 10 ppm. The pH of the solution was equal to 8.0.

Equipment:

In this example, use was made of electrolytic deposition equipment composed of two parts: the cell intended to contain the electrodepositing solution, equipped with a fluid recirculation system in order to control the hydrodynamics of the system, and a rotating electrode equipped with a sample holder suitable for the size of the coupons used (4 cm×4 cm). The electrolytic deposition cell comprised two electrodes:

an inert carbon graphite anode (anode),
the structured silicon coupon coated with the layer of copper which constitutes the cathode,
the reference being connected to the anode.

Connectors enabled electrical contacting of the electrodes, which were connected by electrical wires to a potentiostat supplying up to 20 V or 2 A.

B. Experimental Protocol

The cathode was polarized in galvano-pulsed mode in a current range of from 3 mA (or 0.38 mA/cm$^2$) to 35 mA (or 4.38 mA/cm$^2$), for example 9 mA (or 1.14 mA/cm$^2$) with a pulse frequency of between 1 and 10 kHz in cathodic polarization, and between 0.5 and 5 kHz in zero polarization between two cathodic pulses. The rotation of the cathode was set at 6 rpm.

The duration of the electrodeposition step was 14 minutes in order to obtain complete filling of the trenches 25 nm wide and 75 nm deep.

C. Results Obtained

A TEM analysis reveals filling with cobalt metal obtained by a bottom-up mechanism of good quality.

However, the compound that was deposited at the surface consists exclusively of cobalt oxide, whereas it is desired to obtain cobalt.

In addition, the filling time is very long when the cobalt is complexed in a basic medium. The 20 nm-thick layer of cobalt oxide which formed on the surface of the substrate was obtained in 12 min.

These results underline the need to work at acidic pH in order to obtain cobalt metal at a sufficient speed.

The invention claimed is:

1. Electrolyte for the electrodeposition of cobalt, characterized in that the electrolyte is an aqueous solution consisting essentially of from 1 to 5 g/l of cobalt II ions, from 1 to 10 g/l of chloride ions, an acid in an amount sufficient to obtain a pH of between 1.8 and 4.0, and at most two organic additives, said organic additives not being polymers, and the concentration of the organic additive or the sum of the concentrations of the two organic additives is between 5 and 200 mg/l.

2. Electrolyte according to claim 1, characterized in that the organic additive(s) have a molecular weight of less than 250 g/mol and greater than 50 g/mol.

3. Electrolyte according to claim 1, characterized in that it comprises at most one organic additive.

4. Electrolyte according to claim 1, characterized in that the organic additive(s) are chosen from alpha-hydroxy carboxylic acids.

5. Electrolyte according to claim 1, characterized in that the acid is hydrochloric acid and that at least one of the organic additives is chosen from organic compounds which have at least 1 pKa ranging from 1.8 to 3.5.

6. Electrolyte according to claim 5, characterized in that at least one of the organic additives is chosen from citric acid, tartaric acid, malic acid, mandelic acid, maleic acid, fumaric acid, glyceric acid, orotic acid, malonic acid, L-alanine, acetylsalicylic acid and salicylic acid.

7. Electrolyte according to claim 1, characterized in that the cobalt II ions are in free form, that is to say not complexed with the organic additive(s).

8. Electrolyte according to claim 1, characterized in that its pH is between 2.0 and 3.5.

9. Electrochemical process for filling cavities, said process comprising:
- a step of bringing a conductive surface of said cavities into contact with an electrolyte in accordance with claim 1,
- a step of polarizing the conductive surface for a period of time sufficient to carry out the conformal and complete filling of the cavities by deposition of the cobalt, and
- a step of annealing the cobalt deposit obtained at the end of the polarization step.

10. Process according to claim 9, characterized in that the cavities are obtained by carrying out the following steps:
- a step of etching structures in a silicon substrate,
- a step of forming a layer of silicon oxide on a silicon surface of the structures so as to obtain a silicon oxide surface,
- a step of depositing a layer of metal on said silicon oxide surface so as to obtain the conductive surface of the cavities.

11. Process according to claim 10, characterized in that the layer of metal comprises at least one compound chosen from the group consisting of cobalt, copper, tungsten, titanium, tantalum, ruthenium, nickel, titanium nitride and tantalum nitride.

12. Process according to claim 9, characterized in that the cavities have a width or a diameter at the opening of between 10 nm and 40 nm and a depth of between 50 nm and 250 nm.

13. Process according to claim 9, characterized in that the cobalt deposit has a content of impurities of less than 1000 ppm atomic and that it comprises an average void percentage of less than 10% by volume or by surface area, measured by electron microscopy.

14. Process according to claim 9, characterized in that the cobalt deposition speed is between 0.1 and 3.0 nm/s.

* * * * *